US011158370B2

(12) United States Patent
Merced Grafals et al.

(10) Patent No.: US 11,158,370 B2
(45) Date of Patent: Oct. 26, 2021

(54) MEMRISTIVE BIT CELL WITH SWITCH REGULATING COMPONENTS

(71) Applicant: Hewlett Packard Enterprise Development LP, Houston, TX (US)

(72) Inventors: Emmanuelle J. Merced Grafals, Palo Alto, CA (US); Brent Buchanan, Palo Alto, CA (US); Le Zheng, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 736 days.

(21) Appl. No.: 16/065,364

(22) PCT Filed: Jan. 26, 2016

(86) PCT No.: PCT/US2016/014856
§ 371 (c)(1),
(2) Date: Jun. 22, 2018

(87) PCT Pub. No.: WO2017/131628
PCT Pub. Date: Aug. 3, 2017

(65) Prior Publication Data
US 2021/0193222 A1 Jun. 24, 2021

(51) Int. Cl.
*G11C 11/00* (2006.01)
*G11C 13/00* (2006.01)

(52) U.S. Cl.
CPC .. *G11C 13/0069* (2013.01); *G11C 2013/0073* (2013.01); *G11C 2213/72* (2013.01); *G11C 2213/74* (2013.01); *G11C 2213/79* (2013.01)

(58) Field of Classification Search
CPC ........ G11C 13/0069; G11C 2013/0073; G11C 2013/72; G11C 2213/74
(Continued)

(56) References Cited

U.S. PATENT DOCUMENTS

| 6,847,047 B2 | 1/2005 | VanBuskirk et al. |
| 2004/0145938 A1* | 7/2004 | Tihanyi ............. G11C 13/0069 365/105 |

(Continued)

FOREIGN PATENT DOCUMENTS

WO  WO-2014118255  8/2014

OTHER PUBLICATIONS

Yakopcic, C. et al.; "Hybrid Crossbar Architecture for a Memristor Based Memory"; 2014; 5 pages.
(Continued)

*Primary Examiner* — Vu A Le
(74) *Attorney, Agent, or Firm* — Hewlett Packard Enterprise Patent Department

(57) ABSTRACT

In one example in accordance with the present disclosure a memristive bit cell is described. The memristive bit cell includes a memristive device switchable between states. The memristive device is to store information. The memristive bit cell also includes a first switch regulating component coupled to the memristive device. The first switch regulating component enforces compliance of the memristive device with a first property threshold when switching between states in a first direction. The first property threshold corresponds to a state of the memristive device. The memristive bit cell also includes a second switch regulating component coupled to the memristive device. The second switch regulating component enforces compliance of the memristive device with a second property threshold when switching between states in a second direction. The second property threshold corresponds to a state of the memristive device.

15 Claims, 6 Drawing Sheets

(58) Field of Classification Search
USPC .......................................................... 365/148
See application file for complete search history.

(56) References Cited

U.S. PATENT DOCUMENTS

| | | |
|---|---|---|
| 2013/0054886 A1 | 2/2013 | Eshraghian et al. |
| 2014/0140122 A1 | 5/2014 | Siau |
| 2014/0153314 A1 | 6/2014 | Baker et al. |
| 2014/0166957 A1 | 6/2014 | Yang et al. |
| 2014/0313816 A1 | 10/2014 | Ribeiro et al. |
| 2014/0355331 A1 | 12/2014 | Yi et al. |
| 2014/0369108 A1* | 12/2014 | Mohammad .......... G06F 30/392 365/148 |
| 2019/0043577 A1* | 2/2019 | Buchanan .......... G11C 13/0069 |

OTHER PUBLICATIONS

Search Report and Written Opinion received for PCT Application No. PCT/US2016/014856, dated Sep. 12, 2016, 10 pages.

* cited by examiner

MEMRISTIVE BIT CELL WITH SWITCH REGULATING COMPONENTS

BACKGROUND

Memristive devices, for example memristors, are devices that may be programmed to different states by applying a programming energy, for example a voltage pulse or a current pulse. After programming, the state of the memristive device may be read. The state of the memristive device remains stable long enough to regard the device as non-volatile. A number of memristive devices may be included within a crossbar array in which a number of interconnect lines intersect one another to form a grid, the memristive device being located at the intersection of corresponding interconnect lines. These arrays can provide high storage density. Memristor devices can be used in a variety of applications, including non-volatile solid state memory, programmable logic, signal processing, control systems, pattern recognition, and other applications.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Figure 1:
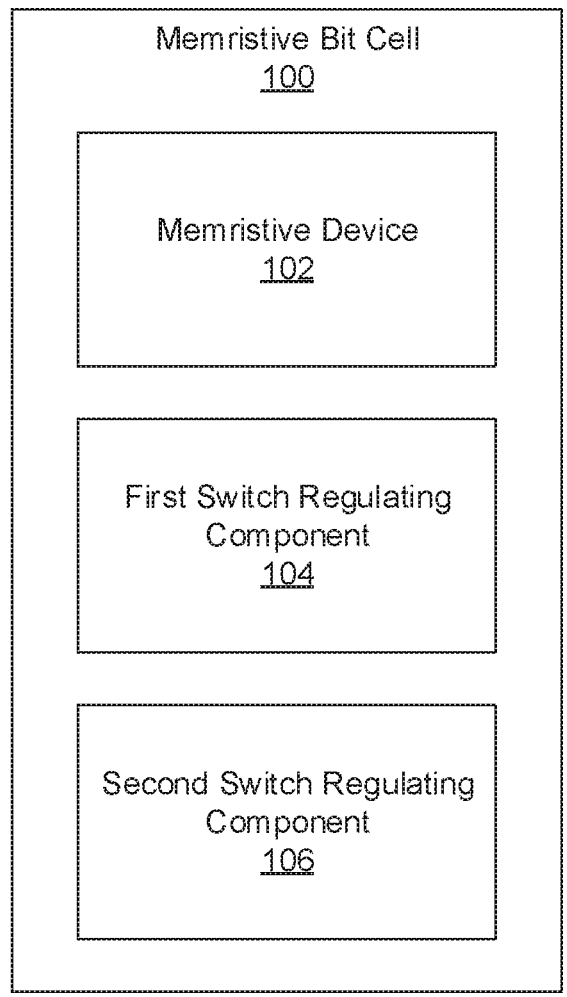
FIG. 1 is a block diagram of a memristive bit cell with switch regulating components, according to one example of the principles described herein.

Arrays of memristive devices such as memristors may be used in a variety of applications, including non-volatile solid state memory, programmable logic, signal processing, control systems, pattern recognition, and other applications. Increasingly smaller computing devices have led to an increased focus on developing smaller components, such as memory arrays and integrated circuits that carry out the functions listed above as well as other functions. Crossbar arrays are one example of reduced-size memory arrays. A crossbar array includes a first set of interconnect lines that intersect a second set of interconnect lines, in an approximately orthogonal orientation for example. Throughout the specification, the first set of interconnect lines may be referred to as row lines and the second set of interconnect lines may be referred to as column lines. However the terms row and column are merely used to simplify the description and the first set of interconnect lines and second set of interconnect lines may be oriented in other fashions than rows or columns.

A bit cell is placed at each intersection of a row line and a column line. A bit cell may include a memory element to store information. In this example, a number of memory elements may share a particular row line and another number of memory elements may share a particular column line.

The array of the present application can also be used to perform a multiply-accumulate (MAC) operation of, for example, a number of matrix values and a number of input vector values. For example, an input voltage signal along each row of an array is weighted by the conductance of the memory devices in a column, and accumulated as the current output from each column. Accordingly, a state of a memristive device can be used to either store information such as in a memory array, or can be used to perform operations such as a multiply-accumulate operation which is used in filtering.

In either case, each memory device can represent multiple logic values, for example a 1 and a 0. Memristive devices are also capable of representing more values, for example, up to four and higher numbers of logic values. Memory devices such as memristive devices use conductance levels to indicate a particular logic value. In using a memristor as an element in a memory array, a digital operation is emulated by applying an activation stimulus such as voltage pulses of different values or polarities to place the memristive device in different states. Switching a memristive device such as a memristor from a lower conductance state in the direction of a higher conductance state is referred to as a "set" operation and switching the memristive device form a higher conductance state in the direction of a lower conductance state is referred to as a "reset" operation.

Each memristive device has a switching voltage which refers to a voltage potential across a memristive device which starts a change in the conductance state of the memristive device. For example, a switching voltage of a memristive device may be between 1-2 volts (V). In this example, a voltage potential across the memristive element that is greater than the switching voltage (i.e., the 1-2V) causes the memristive device to begin to change between conductance states. The switching voltage may be different between a set operation and a reset operation. For example, the switching voltage for a set operation may be of a particular value and polarity and the switching operation for a reset operation may be another value and/or polarity. While specific reference is made to voltage pulses, other activation stimuli may also be used such as current. While memristive device arrays have the potential for widespread application, some characteristics reduce their usefulness in certain applications.

For example, while memristive devices have the capability of representing multiple logic values by being placed in multiple conductance states, the memristive device switching dynamics makes accessing these multiple conductance states difficult. More specifically, control circuits to switch the memristive devices tend to over-drive the memristive devices making it difficult to place them in intermediate states between a lowest conductance state and a highest conductance state. For example, a set operation is dominated by a thermal runaway process. More specifically, during a set operation as the current increases through the memristive device, the conductance of the memristive device increases, which in turn increases the current further. A reset operation is dominated by a voltage potential across the memristive device and as the memristive device conductance decreases, the greater the voltage drop across it grows, which further decreases the conductance. Both of these feedback mechanisms make it difficult to stop the switching when the memristive device reaches an intermediate state.

Accordingly, the present specification describes a memristive bit cell that alleviates these and other complications. Specifically, the memristive bit cell includes a first switch regulating component such as a transistor that can slow or stop the switching process by enforcing compliance of the memristive device with a current threshold. The memristive bit cell includes a second switch regulating component, such as a diode, that can slow or stop the reset switching process by enforcing compliance of the memristive device with a voltage threshold. The switch regulating components can enforce compliance with different threshold values, each threshold value corresponding to a particular state of the memristive device. Accordingly, a threshold can be set that corresponds to the desired state of the memristive device and a switching operation (i.e., set or reset) can be initiated. Once initiated, the regulating components ensure that the voltage or current of the memristive device does not get past the threshold. In other words, the regulating components ensure that the voltage and/or current through the memristive device matches the voltage threshold or current threshold. As these thresholds correspond to particular states, the voltage compliance and/or current compliance thereby ensure that the memristive device is placed in an intended state.

More specifically, the present specification describes a memristive bit cell. The memristive bit cell includes a memristive device to store information, wherein the memristive device is switchable between states. The memristive bit cell also includes a first switch regulating component coupled to the memristive device. The first switch regulating component enforces compliance of the memristive device with a first property threshold when switching between states in a first direction. The first property threshold corresponds to a state of the memristive device. The memristive bit cell also includes a second switch regulating component coupled to the memristive device. The second switch regulating component enforces compliance of the memristive device with a second property threshold when switching between states in a second direction. The second property threshold corresponds to a state of the memristive device.

The present specification also describes a memristive array. The array includes a number of row lines and a number of column lines intersecting the row lines to form a number of junctions. A memristive bit cell is coupled between the row lines and the column lines at the junctions. The memristive bit cell includes a memristive device to store information that is switchable between states. The memristive bit cell also includes a first switch regulating component coupled to the memristive device. The first switch regulating component enforces compliance of the memristive device with a current threshold when switching between states in a first direction. The current threshold corresponds to a state of the memristive device. The memristive bit cell also includes a second switch regulating component coupled to the memristive device. The second switch regulating component enforces compliance of the memristive device with a voltage threshold when switching between states in a second direction. The voltage threshold corresponds to a state of the memristive device.

The present specification describes a memristive bit cell. The memristive bit cell includes a memristive device to store information and being switchable between states. The memristive bit cell also includes a transistor to, during a set operation, enforce compliance of a current through the memristive element against one of a number of current thresholds, wherein a current threshold corresponds to a state of the memristive device. The memristive bit cell also includes an avalanche (or Zener) diode to, during a reset operation, enforce compliance of a voltage across the memristive element against one of a number of voltage thresholds, wherein a voltage threshold corresponds to a state of the memristive device.

Using switch regulating components in a memristive bit cell 1) allows efficient use of multi-level memristive devices; 2) controls set switching and reset switching of a memristive device at a higher granularity to access intermediate states of the memristive device; and 3) makes multi-level memristive devices suitable for various applications including complex vector multiplications, linear transformations, deep neural network operations, cell training, and other operations that implement constant programming. However, it is contemplated that the devices disclosed herein may provide useful in addressing other matters and deficiencies in a number of technical areas. Therefore the systems and methods disclosed herein should not be construed as addressing any of the particular matters.

As used in the present specification and in the appended claims, the term "memristive device" or "memristor" may refer to a passive two-terminal circuit element that maintains a functional relationship between the time integral of current, and/or the time integral of voltage.

Further, as used in the present specification and in the appended claims, the term "property" refers to a characteristic of the memristive device. For example, a first property such as voltage may refer to an electron potential that is across the memristive device and a second property such as current, may refer to the electron flow across the memristive device.

Still further, as used in the present specification and in the appended claims, the term "compliance" refers to an operation wherein the value of a property of a memristive device is maintained below or equal to a threshold value.

Even further, as used in the present specification and in the appended claims, the term "state" refers to a defined configuration of a memristive device wherein the memristive device has defined characteristics. A state may be associated with a logic value. For example, resistance states of a memristive device refers to distinct and different configurations of the memristive device having defined resistance values. Similarly, conductance states of a memristive device refers to distinct and different conductance levels of a memristive device.

Even further, as used in the present specification and in the appended claims, the term "direction" refers to a movement of a memristor device between states device having increased or decreased values for certain properties. For example, switching in a first direction may mean that the memristive device is passing through states of increasing conductance. Switching in a second direction may mean that the memristive device is passing through states of decreasing conductance. It should be noted that an increasing direction of resistance is the same as a decreasing direction of conductance and a decreasing direction of resistance is the same as an increasing direction of conductance.

Further, as used in the present specification and in the appended claims, the term "switching voltage" may refer to a voltage potential across a memristive device which initializes a change in the state of the memristive device. For example, a switching voltage of a memristive device may be between 1-2 volts (V). In this example, a voltage potential across the memristive device that is greater than the switching voltage (i.e., the 1-2 V) causes the memristive device to change between conductance states. A memristive device may have multiple switching voltages. For example, a first switching voltage may be a voltage which, if surpassed, "sets" the memristive device from a low conductance state to a high conductance state. Similarly, a second switching voltage may be a voltage which, if surpassed, "resets" the memristive device from a high conductance state to a low conductance state. While specific reference is made to a voltage pulse, the activation stimulus to change the state of the memristive device may also be provided by a current source.

Even further, as used in the present specification and in the appended claims the term "interconnect lines" refers to conducting electrical lines that are used to select a memristive device. The interconnect lines include the first lines i.e., row lines and the second lines i.e., the column lines.

Even further, as used in the present specification and in the appended claims, the term "a number of" or similar language is meant to be understood broadly as any positive number including 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language indicates that a particular feature, structure, or characteristic described in connection with that example is included as described, but may not be included in other examples.

Turning now to the figures, FIG. 1 is a diagram of a memristive bit cell (100) with switch regulating components (104, 106), according to one example of the principles described herein. Each memristive bit cell (100) includes a memristive device (102). A memristive device (102) stores information based on a conductance level of the memristive device (102), each level corresponding to a state of the memristive device (102). By switching between conductance states, the memristive device (102) therefore represent multiple logic values and store multiple bits of information.

Put another way, the memristive device (102) can be used to represent a number of bits of data. For example, a memristive device (102) in a first conductance state may represent a logic value of "0." The same memristive device (102) in a second conductance state may represent a logic value of "1." Each logic value is associated with a conductance state of the memristive device (102) such that data can be stored in a memristive device (102) by changing the conductance state of the memristive device (102). This may be done by applying a voltage potential across a target memristive device (102) by passing voltages to interconnect lines that correspond to the target memristive device (102). While specific mention is made of memristive devices (102) representing two logic values, i.e., a binary memristive device (102), a memristive device (102) can have any number of conductance states and therefore can represent any number of logic values. For example a memristive device (102) can have three, four, or even more conductance states.

A memristive device (102) changes conductances by transporting dopants within a switching layer to increase or decrease the conductivity of the memristive device (102). As a sufficient voltage is passed across the memristive device (102) the dopants become active such that they move within a switching layer of the memristive device (102) and thereby change the conductance of the memristive device (102).

A memristive device (102) is non-volatile because the memristive device (102) maintains its conductivity, and indicated logic value even in the absence of a supplied voltage. In this manner, the memristive device (102) are "memory resistors" in that they "remember" the last conductance that they had. Put another way, if charge flows in one direction through a memristive device (102), the conductance of that component of the circuit will increase. If charge flows in the opposite direction in the memristive device (102), the conductance will decrease. If the flow of charge is stopped by turning off the applied voltage, the memristive device (102) will "remember" the last conductance that it had, and when the flow of charge starts again the conductance of the memristive device (102) will be what it was when it was last active.

Memristive devices (102) in a memristor array may take many forms. One example is a metal-insulator-metal structure where the memristive devices (102) include a first conductive electrode a second conductive electrode and a switching element placed between the conductive electrodes. The first and second conductive electrodes may be formed of an electrically conductive material such as AlCu, AlCuSi, TaAl, TiN, HfN, AlN, Pt, Cu, and WSiN. In some examples the first and second electrode are formed of the same material, and in other examples the second electrode is formed of a different material than the first electrode.

The switching element may be formed of a switching oxide, such as a metallic oxide. Specific examples of switching oxide materials may include magnesium oxide, titanium oxide, zirconium oxide, hafnium oxide, vanadium oxide, niobium oxide, tantalum oxide, chromium oxide, molybdenum oxide, tungsten oxide, manganese oxide, iron oxide, cobalt oxide, copper oxide, zinc oxide, aluminum oxide, gallium oxide, silicon oxide, germanium oxide, tin dioxide, bismuth oxide, nickel oxide, yttrium oxide, gadolinium oxide, and rhenium oxide, among other oxides. In addition to the binary oxides presented above, the switching oxides may be ternary and complex oxides such as silicon oxynitride. The oxides presented may be formed using any of a number of different processes such as sputtering from an oxide target, reactive sputtering from a metal target, atomic layer deposition (ALD), oxidizing a deposited metal or alloy layer, etc. The memristive device (102) may be fabricated through any other reasonably suitable fabrication process, such as, for example, chemical vapor deposition, sputtering, etching, lithography, or other methods of forming memristive device (102).

The memristive devices (102) may be built at the micro- or nano-scale and used as a component in a wide variety of electronic circuits, such as, bases for memories and logic circuits. As described above, when used as a basis for memories, the memristive device (102) may be used to store bits of information. When used as a logic circuit, as described herein, the memristive device (102) may be employed to represent bits in a field programmable gate array, as the basis for a wired-logic programmable logic array, or as a dot product engine. The memristive device (102) disclosed herein may also find use in a wide variety of other applications.

The state of the memristive devices (102) may be changed in response to various programming conditions and the memristive device (102) is able to exhibit a memory of past electrical conditions. For instance, the memristive device (102) may be programmed to have one of a plurality of distinct states. Particularly, the conductance level of the switching element may be changed through application of an electrical field, e.g., through application of a current or voltage, in which the current or voltage may cause mobile dopants in the switching element to move and/or change the status of conducting channel(s) in the switching element, which may alter the resulting electrical operation of the memristive device (102). That is, for instance, the distinct conductance levels of the switching element, and thus the state of the memristive device (102), may correspond to different programming current levels or voltage amplitudes applied to the switching element.

By way of example, the switching element may be programmed to have a lower conductance level through application of an earlier current or voltage level. After removal of the current or voltage, the locations and characteristics of the dopants or conducting channels are to remain stable until the application of another programming electrical field. That is, the switching element remains at the programmed conductance level following removal of the current or voltage. While specific reference is made to memristive devices (102), other resistive memory elements may be used also. Other examples of resistive memory elements include resistive random-access memory (RRAM) elements, phase-change random-access memory (PCRAM), and magnetoresistive random-access memory (MRAM).

Each bit cell (100) also includes a first switch regulating component (104). The first switch regulating component (104) is coupled to the memristive device (102) to enforce compliance of the memristive device (102) with a first property threshold when switching between states in a first direction. The first property threshold corresponds to a state of the memristive device (102). For example, as described above, a state of the memristive device (102) is used to represent a logic value. The state can be defined by a property value of the memristive device (102). For example, in one state, the memristive device (102) has a particular property value and in another state the memristive device has another value for that property. Accordingly, the first switch regulating component (104) establishes a value of a first property of the memristive device (102), and therefore a corresponding state of the memristive device (102), by enforcing compliance with a threshold value for that first property.

Similarly, each bit cell (100) also includes a second switch regulating component (106). The second switch regulating component (106) is also coupled to the memristive device (102) to enforce compliance of the memristive device (102) with a second property threshold when switching between states in a second direction. The second property threshold also corresponds to a state of the memristive device (102). For example, in one state, the memristive device (102) has a particular property value and in another state the memristive device has another value for the property. Accordingly, the second switch regulating component (106) establishes a value of a second property of the memristive device (102), and therefore a corresponding state of the memristive device (102), by enforcing compliance with a threshold value for that second property.

The first switch regulating component (104) is used to control switching in a first direction, for example when going from a lower conductance state to a higher conductance state, i.e., a set operation. The second switch regulating component (106) is used to control switching in a second direction, for example when going form a higher conductance state to a lower conductance state, i.e., a reset operation.

Each of the switch regulating components (104, 106) can enforce compliance of the memristive device (102) with multiple property thresholds. For example, the first switch regulating component (104) can, at different times enforce compliance with a first property threshold of a first value and at another time can enforce compliance of a first property threshold of a second value. Similarly, the second switch regulating component (106) can, at different times, enforce compliance with different values for the second property threshold.

The first property and the second property may be different. For example, during a set operation, a first switch regulating component (104) such as a transistor can enforce current compliance of the memristive device (102). During a reset operation, a second switch regulating component (106), such as a diode, can enforce voltage compliance of the memristive device (102).

The property thresholds are different between a set operation and a reset operation due to the different driving factors during a set and reset operation. For example, a set operation is driven by a thermal runaway process due to positive feedback. For example, as the current increases through the memristive device (102), the conductance of the memristive device (102) increases as described above during the switching event. As the conductance continues to increase during the switching event, the current continues to increase further. This can lead to an over-set of the memristive device. However, by enforcing a current compliance via a transistor, the maximum amount of current through the memristive device (102) is capped by a current threshold and the switching can therefore be stopped, at a particular current level.

By comparison, during a reset operation, a voltage potential drives the reset operation. For example, at the onset of a reset operation, the memristive device (102) conductance starts to decrease, which increases the voltage drop across the memristive device (102). The increased voltage drop across the memristive device (102) continues to decrease the conductance of the memristive device (102). This can lead to an over-reset of the memristive device (102). However, by enforcing a voltage compliance via a diode, the maximum amount of voltage across the memristive device (102) is capped by a voltage threshold and the switching can therefore be stopped, at a particular voltage level.

In other words, the reset and set operations include an inherent feedback based on voltage and current, respectively. With this feedback, each operation accelerates as it goes further along thereby increasing the difficulty of setting the memristive devices (102) to intermediate states. In controlling this feedback by imposing different maximum currents and voltages associated with each memristive device (102), the switching operations can be stopped at specific levels corresponding to intermediate states of the memristive device (102).

Put another way, the switch regulating components (104, 106) afford more control over the switching operations. For example, resetting has historically been difficult as memristive devices (102) have been only switchable between a few intermediate conductance states. Accordingly, if during a set operation a target value was overshot, rather than incrementally decreasing towards the target value, a hard reset was used, and the entire set operation re-initialized. With the switch regulating components (104, 106) described herein, finer tune control is achieved for both a set direction and a reset direction allowing for multiple states, i.e., more than two states, of the memristive device (102) to be used.

Accordingly, single memristive device (102) can easily store more than two bits of information, or represent more than two logic values.

Figure 2:
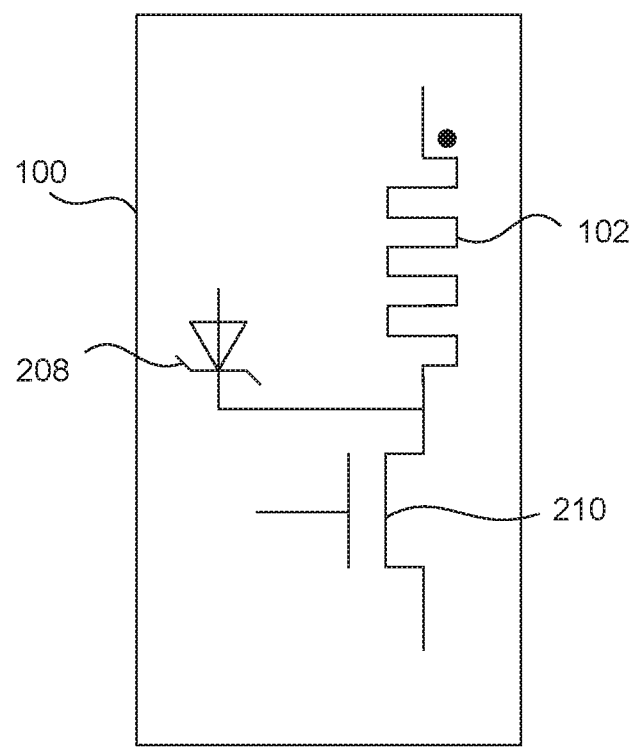
FIG. 2 is a circuit diagram of a memristive bit cell with switch regulating components, according to one example of the principles described herein.

FIG. 2 is a circuit diagram of a memristive bit cell (100) with switch regulating components (FIG. 1, 104, 106), according to one example of the principles described herein. As described above, the memristive bit cell (100) includes a memristive device (102) switchable between states to store bits of information. The memristive device (102) as described above is composed of a top electrode, a switching layer, and a bottom electrode. In FIG. 2 and the remaining figures, the top electrode of the memristive device (102) is indicated with a dot.

The memristive bit cell (100) also includes a transistor (210) to, during a set operation, enforce compliance of a current passing through the memristive device (102) against one of a number of current thresholds where a current threshold corresponds to a state of the memristive device (102). Enforcing compliance as used herein means that a switching in the particular direction is stopped when the property value through the memristive device (102) matches the threshold or is within a tolerance range of the threshold value. Accordingly, in enforcing current compliance, the transistor (210) stops the set operation when the current through the memristive device (102) matches a current threshold, which current threshold is set by the voltage applied on the gate of the transistor (210) as described below.

As described above, during a set operation, a current running through the memristive device (102) dominates in that as current increases during setting, the conductance of the memristive device (102) goes up and the current increases even further. Accordingly, a transistor (210) in saturation which acts as a variable resistor can be used to limit the current passing through the memristive device (102). For example, during setting, the current limit of the transistor (210) is set by applying a particular voltage to a gate of the transistor (210). By setting the resistance of the transistor (210) to a particular value, the current allowed through the transistor (210) and the corresponding memristive device (102) can be limited. Accordingly, different voltages can be applied to the gate of the transistor (102) to 1) limit the current through the memristive device (102) to a particular value and 2) set the memristive device (102) to one of multiple intermediate states in a first, i.e., set, direction.

The memristive bit cell (100) also includes an avalanche diode (208) to, during a reset operation, enforce compliance of a voltage passing through the memristive device (102) against one of a number of voltage thresholds where a voltage threshold corresponds to a state of the memristive device (102). While FIG. 2 depicts an avalanche diode (208) which is operated at reverse bias, other types of diodes could be used as well. For example a Zener diode operated at reverse bias, or a non-avalanche diode operated at forward bias.

As enforcing compliance means that a switching in the particular direction is stopped when the property value of the memristive device (102) matches the threshold; in enforcing voltage compliance, the avalanche diode (208) stops the reset operation when the voltage across the memristive device (102) matches a voltage threshold, which voltage threshold is set by the voltage applied on the anode of the avalanche diode (208).

As described above, during a reset operation, a voltage applied to the memristive device (102) dominates in that as a voltage drop across the memristive device (102) increases during setting, the conductance of that memristive device (102) goes down and the voltage drop continues to increase, which increases the speed and effect of the reset process. Accordingly, an avalanche diode (208), which is a diode that is reverse biased that breaks down when a sufficiently large voltage is applied, is electrically coupled to the memristive device (102) in parallel. When in parallel with the memristive device (102), the avalanche diode (208) limits the maximum voltage across the memristive device (102) as components that are parallel to one another have the same voltage potential. By setting the voltage at the anode of the avalanche diode (208) to a particular value, the voltage allowed through the memristive device (102) can be selected. Accordingly, different voltages can be applied to the anode of the avalanche diode (208) to 1) limit the voltage through the memristive device (102) to a particular value and 2) set the memristive device (102) to one of multiple intermediate states in a second, i.e., reset, direction. While FIG. 2 depicts specific types of elements used to enforce current compliance and voltage compliance, any other type of circuit or element may be used to enforce voltage compliance and current compliance, such as current mirrors and circuits for feedback voltage tuning.

In using the transistor (210) such as a metal-oxide semiconductor field-effect transistor (MOSFET) and an avalanche or Zener diode (208) to enforce variable current compliance and variable voltage compliance respectively, a higher level of memristive device (102) conductance control is possible. More specifically, the memristive bit cell (100) described herein takes advantage of the variable conductance nature of a MOSFET and an avalanche diode (208) and their interactions with the memristive device (102) when connected in the same circuit. By correctly biasing the cell elements (i.e., the transistor (210) and the avalanche diode (208) during programming, the limits of the memristive device (102) switching dynamics can be set so as to prevent overshoot. Doing so decreases the latency in writing the memristive bit cell (100) in either the set or the reset direction.

Figure 3:
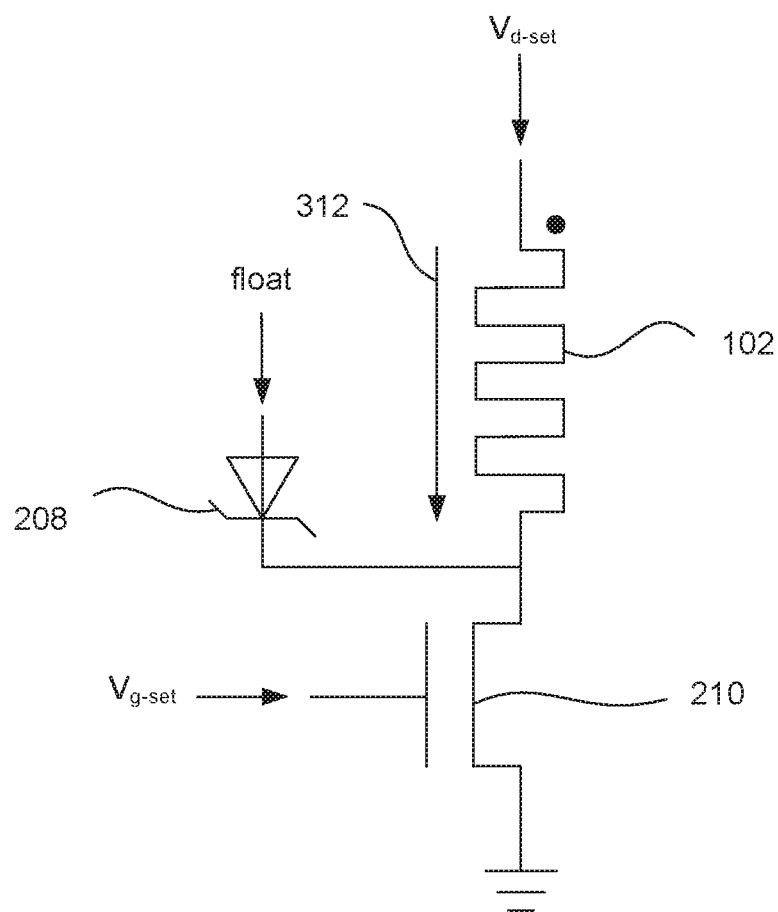
FIG. 3 is a circuit diagram of a memristive bit cell with switch regulating components during a set operation, according to one example of the principles described herein.

FIG. 3 is a circuit diagram of a memristive bit cell (FIG. 1, 100) with switch regulating components (FIG. 1, 104, 106) during a set operation, according to one example of the principles described herein. During a set operation, a memristive device (102) is moved from a first state having a particular conductance level to a second and more conductive state. For example, a memristive device (102) in the first state may have a conductance of 1e-5 Siemens (S) and the second conductance state may have a conductance of 2e-4 S. Note that in FIGS. 3 and 4 reference to specific voltages and conductances is merely for illustration and any conductance and voltage values may be used herein. In a set operation, the avalanche diode (208) is not used. Accordingly, the avalanche diode (208) is allowed to float.

To set a memristive device (102), a voltage potential is applied across the memristive device (102). This may be done for example, by applying voltages to either end of the memristive bit cell (FIG. 1, 100). More specifically, a first voltage, $V_{d\text{-}set}$, is applied to a top electrode of the memristive device (102) and the bottom electrode is set to ground via the transistor (210). Doing so generates a voltage potential equal to $V_{d\text{-}set}$ across the memristive device (102) which initiates the movement of dopants within the memristive device (102) as described above. As the memristive device (102) begins to change state, current flows through the memristive device (102) as indicated by the arrow (312).

However, if just the voltage potential $V_{d\text{-}set}$ is used, as described above a positive feedback may over-set the memristive device (102). Accordingly, a voltage, $V_{g\text{-}set}$, is applied to the gate of the transistor (210), which gate voltage sets the resistance of the transistor (210) and also limits the maximum current that passes through the transistor (210) and the corresponding memristive device (102). As described above, different $V_{g\text{-}set}$ values may correspond to different current thresholds which thresholds in turn correspond to particular states of the memristive device (102) and corresponding logic values. In other words, the gate voltage maps to 1) a maximum current passing through the memristive device (102), 2) a conductance state of the memristive device (102), and 3) a logic value indicated by the conductance state.

A few specific numeric examples are provided as follows. In these examples, it is presumed that a memristive device has 5 states identified as 0, 1, 2, 3, and 4, a state 0 being the lowest conductance and a state 4 being the highest conductance. During a set operation, the $V_{d\text{-}set}$ value may be a predetermined value that is not dependent upon the target state of the memristive device (102). For this example, $V_{d\text{-}set}$ may be a value of 2.5 V. As described above, the drain of the transistor (210) may be ground in any set operation, and the avalanche diode (208) may be floated. When transitioning from a 0 state (i.e., lowest conductance) to a 4 state (i.e., highest conductance), $V_g$-set may be set to a value that corresponds to state 4, for example, 2.0 V. Setting the $V_{g\text{-}set}$ to this value establishes a current threshold for the memristive element (102) that corresponds to state 4. The value $V_g$-set is greater than a threshold value of the transistor such that the transistor is on and allows current to flow through the memristive device (102).

The $V_{g\text{-}set}$ value changes depending upon the target state. For example, instead of going form a 0 state to a 4 state, presume the target state is 3, i.e., the memristive device (102) is to transition from a 0 state to a 3 state. In this example, $V_{g\text{-}set}$ may be set to a value that corresponds to state 3, for example 1.5V. Setting the $V_g$-set to this value establishes a current threshold for the memristive element (102) that corresponds to state 3.

In other words, each $V_{g\text{-}set}$ value that is applied to the gate of the transistor (210) corresponds to a different state of the memristive device (102). Doing so ensures that the memristive device (102) does not overshoot a target state by stopping the switching in the set direction via the maximum current allowed by the transistor (210). In other words, while $V_{d\text{-}set}$ is a value that switches the memristive device (102), $V_{g\text{-}set}$ is a cap to ensure that the memristive device (102) does not go to a state greater than desired. During a set operation, a higher $V_{g\text{-}set}$ value results in a higher programming state (i.e., higher conductance) of the memristive device (102).

Thus as illustrated in FIG. 3, the memristive bit cell (100) with a transistor (210) as a first switch regulating component (FIG. 1, 104) allows for controlled switching of a memristive device (102) by stopping a set operation such that the memristive device (102) is not overdriven and therefore can be set to intermediate states. As the control over the set operation has a finer granularity due to the presence of the transistor (210), the memristive device (102) may be programmable to a greater number of states than would otherwise be possible.

In some examples, a subsequent read operation may be performed to ensure that the memristive device (102) current value has not superseded the current threshold imposed by the transistor (210). In other words, the subsequent read operation verifies that the memristive device (102) is in the desired state. The subsequent read operation may be executed by generating a voltage potential across the memristive device (102). The voltage potential across the memristive device (102) during a read operation is small enough so as to not be greater than any switching voltage for the memristive device (102). In other words, the read voltage does not disturb the dopants, nor effect the state, of the memristive device (102).

Figure 4:
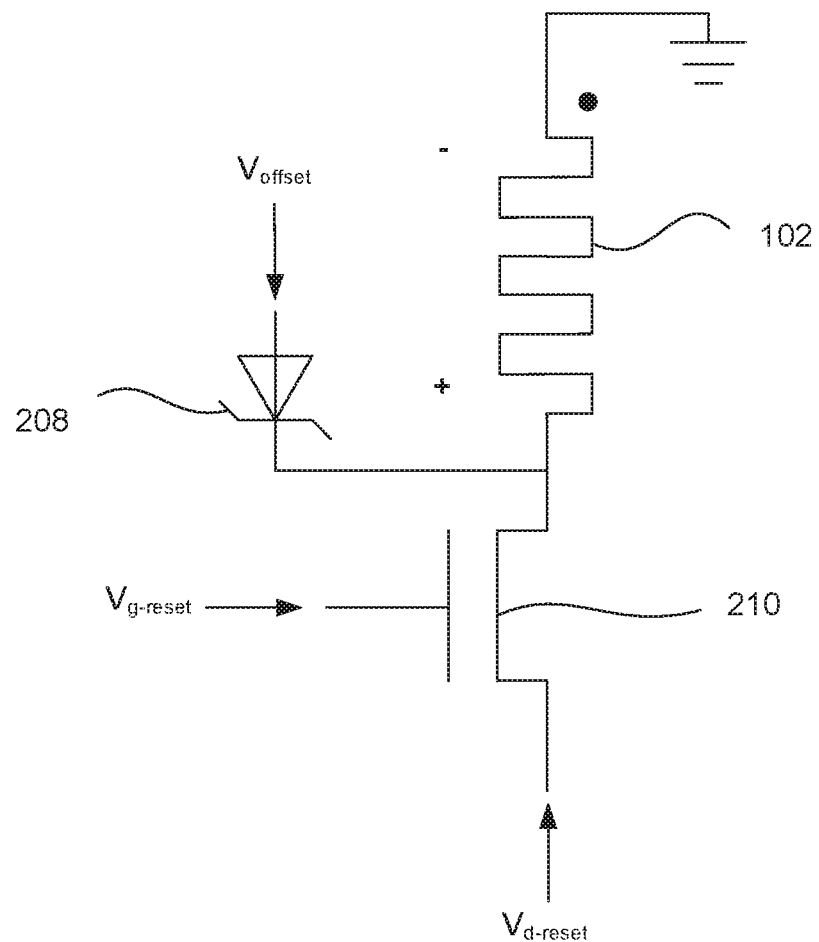
FIG. 4 is a circuit diagram of a memristive bit cell with switch regulating components during a reset operation, according to one example of the principles described herein.

FIG. 4 is a circuit diagram of a memristive bit cell (FIG. 1, 100) with switch regulating components (FIG. 1, 104, 106) during a reset operation, according to one example of the principles described herein. Using the conductance values described above, during a reset operation, a memristive device (102) is moved from the second state (i.e., having a conductance of 2e-4 Siemens) to the first state (i.e., having a conductance of $1e10^{-5}$ Siemens (S)). In other words, the reset operation is in an opposite direction (high to low conductance) as compared to the set operation which is from a low conductance to a high conductance.

To reset a memristive device (102) a voltage potential is generated across the memristive device (102). The voltage potential generated during a reset operation may be different from the voltage potential generated during a set operation. This may be done for example, by applying voltages to either end of the memristive bit cell (FIG. 1, 100). More specifically, a value $V_{d\text{-}reset}$ is applied to a bottom electrode of the memristive device (102) via the transistor (210) and the top electrode is set to ground. Doing so generates a voltage potential equal to $V_{d\text{-}reset}$, albeit in an opposite polarity, across the memristive device (102) which initiates the movement of dopants within the memristive device (102) as described above. As the memristive device (102) begins to change state, a voltage potential is generated across the memristive device (102) as indicated in FIG. 4.

However, if just the voltage potential $V_{d\text{-}reset}$ is used, as described above a positive feedback may over-reset the memristive device (102). Accordingly, during a reset operation, a voltage, $V_{offset}$, is applied to an anode of the avalanche diode (208). It is this voltage, $V_{offset}$, controls the voltage compliance. As described above, different $V_{offset}$ values may correspond to different voltage thresholds which thresholds in turn correspond to particular states of the memristive device (102) and corresponding logic values. In other words, a voltage applied to the anode of the avalanche diode (208) maps to 1) a maximum voltage passing through the memristive device (102), 2) a conductance state of the memristive device (102), and 3) a logic value indicated by the reference state.

During a reset operation, the transistor (210) may act as a switch to either allow current to pass through the memristive device (102) or to prevent such current flow. In other words, the transistor (210) opens and closes to either form a closed circuit or open circuit in the bit cell (FIG. 1, 102). The transistor (210) has a threshold voltage. When a voltage applied to a gate of the transistor (210) is less than the threshold voltage, the transistor (210) is open such that no current flows to a corresponding memristive device (102). By comparison, when a voltage applied to the gate is at least as great as the threshold voltage, the transistor (210) closes such that current readily flows to a corresponding memristive device (102). In other words, if the transistor (210) is open, no current flows through the bit cell (100) and the memristive device (102) is not selected. However, if the transistor (210) is closed, and a voltage potential is generated via row lines and column lines, current flows through the bit cell (102). Accordingly, if a particular memristive device (102) is to be accessed a voltage, $V_{g\text{-}reset}$, that is greater than the transistor (210) threshold voltage is applied to the gate of the transistor (210) to turn on the transistor (210) channel.

A few specific numeric examples are provided as follows. In these examples, it is presumed that a memristive device (102) has 5 states identified as 0, 1, 2, 3, and 4, a state 0 being the lowest conductance and a state 4 being the highest conductance. During a reset operation, the $V_{d\text{-}reset}$ value may be a predetermined value that is not dependent upon the target state of the memristive device (102). For this example, $V_{d\text{-}reset}$ may be a value of 2.5 V. Still in this example, the top electrode of the memristive device (102) is grounded and a voltage $V_{g\text{-}reset}$ is applied to a gate of the transistor (210) to turn on the transistor (210) channel such that a voltage potential is seen across the memristive device (102). An example value for $V_{g\text{-}reset}$ is 5 V. When transitioning from a 4 state (i.e., highest conductance) to a 0 state (i.e., lowest conductance), $V_{offset}$ may be set to a value that corresponds to state 0, for example, 2.0 V. Setting the $V_{offset}$ to this value establishes a voltage threshold for the memristive element (102) that corresponds to state 0.

The $V_{offset}$ value changes depending upon the target state. For example, instead of going form a 4 state to a 0 state, presume the target state is 1, i.e., the memristive device (102) is to transition from a 4 state to a 1 state, $V_{offset}$ may be set to a value that corresponds to state 1, for example 1.5V. Setting the $V_{offset}$ to this value establishes a voltage threshold for the memristive element (102) that corresponds to state 1.

In other words, each $V_{offset}$ value that is applied to the anode of the avalanched diode (208) corresponds to a different state of the memristive device (102). Doing so ensures that the memristive device (102) does not overshoot a target state by stopping the switching in the reset direction via the maximum voltage that is allowed by the avalanche diode (208). In other words, while $V_{d\text{-}reset}$ is a value that switches the memristive device (102), $V_{offset}$ is a cap to ensure that the memristive device (102) does not go to a state lower than desired. During a reset operation, a higher $V_{offset}$ value results in a lower programming state (i.e., lower conductance) of the memristive device (102).

Thus as illustrated in FIG. 4, the memristive bit cell (100) with an avalanche diode (208) as a second switch regulating component (FIG. 1, 106) allows for controlled switching of a memristive device (102) by stopping a reset operation such that the memristive device (102) is not overdriven and therefore can be set to intermediate states. As the control over the reset operation has a finer granularity due to the presence of the avalanche diode (208), the memristive device (102) may be programmable to a greater number of states than would otherwise be possible. In some examples, a subsequent read operation may be performed as described above.

As demonstrated above in regards to FIGS. 3 and 4, each memristive state may have a corresponding first property threshold and a second property threshold. That is, a state 3 may have a current threshold that is used to set the memristive device (102) to a state 3, and state 3 may also have a corresponding voltage threshold that is used to reset the memristive device (102).

Figure 5:
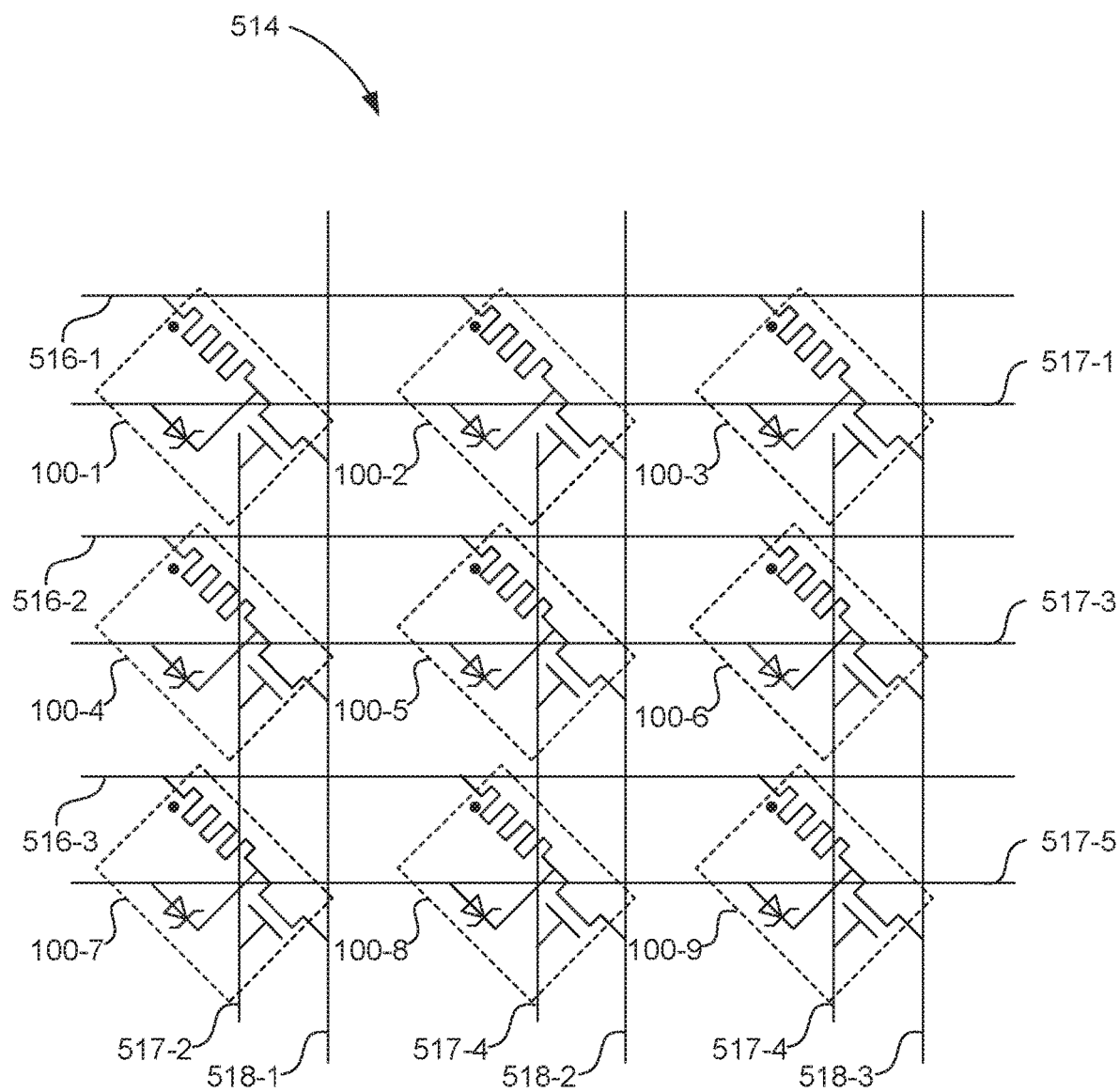
FIG. 5 is a circuit diagram of an array of memristive bit cells with switch regulating components, according to one example of the principles described herein.

FIG. 5 is a circuit diagram of an array (514) of memristive bit cells (100) with switch regulating components (FIG. 1, 104, 106), according to one example of the principles described herein. Memristive bit cells (100-1, 100-2, 100-3, 100-4, 100-5, 100-6, 100-7, 100-8, 100-9) may formed into an array (514) to be used in various applications such as high density storage and other processes such as dot products and matrix multiplication. The memristive array (514) includes a first number of parallel lines which may be referred to as row lines (516-1, 516-2, 516-3). The memristive array (514) also includes a second number of parallel lines which may be referred to as column lines (518-1, 518-2, 518-3). While specific reference is made to row lines and column lines such terms are for illustration and any orientation of interconnect lines may be implemented in accordance with the principles described herein. As used in the present specification, the indicator "-*" refers to a specific instance of an element. For example, a first row line is referenced as (516-1). The absence of the indicator "-*" refers to the element in general. For example, a generic row line is referenced as (516).

The row lines (516) and column lines (518) intersect one another to form junctions. A memristive bit cell (100) is disposed at a junction. For simplicity, just the memristive bit cells (100) are identified with a reference number. However the memristive bit cells (100) depicted in FIG. 5, may be similar to memristive bit cells (100) described above. For example, each memristive bit cell (100) includes a memristive device (FIG. 1, 102) switchable between states to store information, a first switch regulating component (FIG. 1, 104) to enforce compliance with a current threshold, and a second switch regulating component (FIG. 1, 106) to enforce compliance with a voltage threshold. In FIG. 5 the first switch regulating component (FIG. 1, 104) is depicted as a transistor and the second switch regulating component (FIG. 1, 106) is depicted as an avalanche diode.

An array (514) of memristive bit cells (100) as described herein may allow for faster processing. For example, a bottleneck of computing has been the latency associated with programming a memristive cell (100) to a particular value. However, using the first and second switch regulating components (FIG. 1, 104, 106) to offer finer control over the programming, programming latency is reduced, and thereby operations using the memristive array (514) can be carried out more quickly.

The array (514) also includes a number of additional lines (517-2, 517-4, 517-6) that are coupled to columns of first switching components (FIG. 1, 104) and additional lines (517-1, 517-3, 517-5) that are coupled to rows of second switching components (FIG. 1, 106) to allow for the application of voltages to these components to allow current and voltage compliance.

Figure 6:
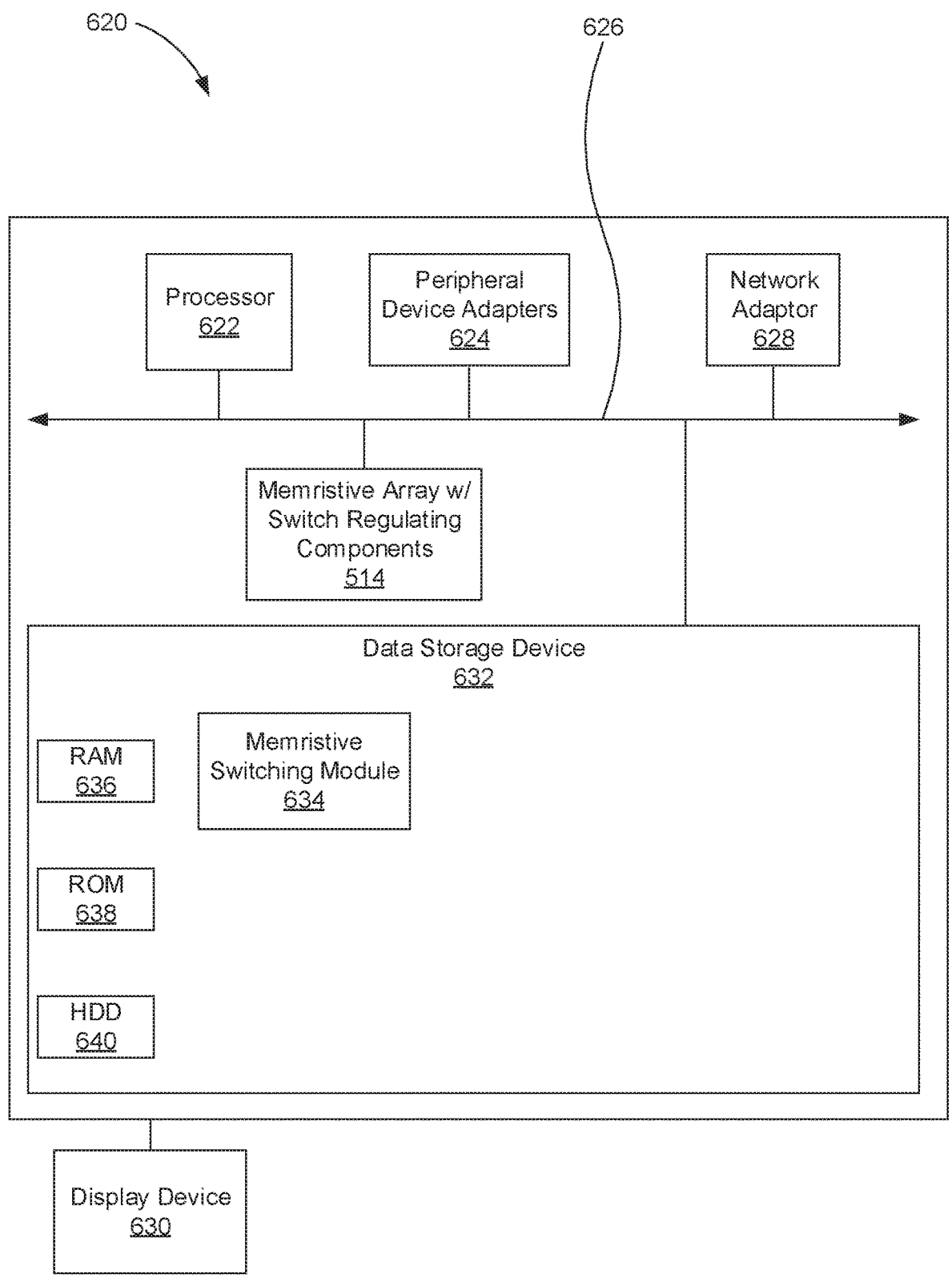
FIG. 6 is a diagram of a computing system that uses a memristive array with switching regulating components, according to one example of the principles described herein.

FIG. 6 is a diagram of a computing system (620) that uses a memristive array (FIG. 5, 514) with switch regulating components (FIG. 1, 10, 106), according to one example of the principles described herein. The computing system (620) may be implemented in an electronic device. Examples of electronic devices include servers, desktop computers, laptop computers, personal digital assistants (PDAs), mobile devices, smartphones, gaming systems, and tablets, among other electronic devices.

The computing system (620) may be utilized in any data processing scenario including, stand-alone hardware, mobile applications, through a computing network, or combinations thereof. Further, the computing system (620) may be used in a computing network, a public cloud network, a private cloud network, a hybrid cloud network, other forms of networks, or combinations thereof. In one example, the methods provided by the computing system (620) are provided as a service over a network by, for example, a third party.

To achieve its desired functionality, the computing system (620) includes various hardware components. Among these hardware components may be a number of processors (622), a number of data storage devices (632), a number of peripheral device adapters (624), and a number of network adapters (628). These hardware components may be interconnected through the use of a number of busses and/or network connections. In one example, the processor (622), data storage device (632), peripheral device adapters (624), and a network adapter (628) may be communicatively coupled via a bus (626).

The processor (622) may include the hardware architecture to retrieve executable code from the data storage device (632) and execute the executable code. The executable code may, when executed by the processor (622), cause the processor (622) to implement at least the functionality of switching a memristive element of a memristive array using a waveform generation device. The functionality of the computing system (620) is in accordance to the methods of the present specification described herein. In the course of executing code, the processor (622) may receive input from and provide output to a number of the remaining hardware units.

The data storage device (632) may store data such as executable program code that is executed by the processor (622) or other processing device. As will be discussed, the data storage device (632) may specifically store computer code representing a number of applications that the processor (622) executes to implement at least the functionality described herein.

The data storage device (632) may include various types of memory modules, including volatile and nonvolatile memory. For example, the data storage device (632) of the present example includes Random Access Memory (RAM) (636), Read Only Memory (ROM) (638), and Hard Disk Drive (HDD) memory (640). Many other types of memory may also be utilized, and the present specification contemplates the use of many varying type(s) of memory in the data storage device (632) as may suit a particular application of the principles described herein. In certain examples, different types of memory in the data storage device (632) may be used for different data storage needs. For example, in certain examples the processor (622) may boot from Read Only Memory (ROM) (638), maintain nonvolatile storage in the Hard Disk Drive (HDD) memory (640), and execute program code stored in Random Access Memory (RAM) (636).

The data storage device (632) may include a computer readable medium, a computer readable storage medium, or a non-transitory computer readable medium, among others. For example, the data storage device (632) may be, an electronic, magnetic, optical, electromagnetic, infrared, or semiconductor system, apparatus, or device, or any suitable combination of the foregoing. More specific examples of the computer readable storage medium may include, for example, the following: an electrical connection having a number of wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store computer usable program code for use by or in connection with an instruction execution system, apparatus, or device. In another example, a computer readable storage medium may be any non-transitory medium that can contain, or store a program for use by or in connection with an instruction execution system, apparatus, or device.

The hardware adapters (624, 628) in the computing system (620) enable the processor (622) to interface with various other hardware elements, external and internal to the computing system (620). For example, the peripheral device adapters (624) may provide an interface to input/output devices, such as, for example, display device (630), a mouse, or a keyboard. The peripheral device adapters (624) may also provide access to other external devices such as an external storage device, a number of network devices such as, for example, servers, switches, and routers, client devices, other types of computing devices, and combinations thereof.

The display device (630) may be provided to allow a user of the computing system (620) to interact with and implement the functionality of the computing system (620). The peripheral device adapters (624) may also create an interface between the processor (622) and the display device (630), a printer, or other media output devices. The network adapter (628) may provide an interface to other computing devices within, for example, a network, thereby enabling the transmission of data between the computing system (620) and other devices located within the network.

The computing system (620) may, when executed by the processor (622), display the number of graphical user interfaces (GUIs) on the display device (630) associated with the executable program code representing the number of applications stored on the data storage device (632). The GUIs may display, for example, interactive screenshots that allow a user to interact with the computing system (620) to input values in association with the memristive array (514) as will be described in more detail below. Additionally, via making a number of interactive gestures on the GUIs of the display device (630), a user may obtain a dot product value based on the input data. Examples of display devices (630) include a computer screen, a laptop screen, a mobile device screen, a personal digital assistant (PDA) screen, and a tablet screen, among other display devices (630).

The computing system (620) may further include a memristive array (514) that includes memristive bit cells (FIG. 1, 100) with switch regulating components (FIG. 1, 104, 106). Such bit cells (FIG. 1, 100) are arranged in an array (514) such as a cross-bar array.

The computing system (620) further includes a number of modules used in the implementation of the systems and methods described herein. The various modules within the computing system (620) include executable program code that may be executed separately. In this example, the various modules may be stored as separate computer program products. In another example, the various modules within the computing system (620) may be combined within a number of computer program products; each computer program product including a number of the modules.

The computing system (620) may include a memristive switching module (634) to, when executed by the processor (622), assist in the functionality of the memristive array (514). The memristive switching module (634), for example, is used to determine the voltages applied to the row lines (FIG. 5, 516), column lines (FIG. 5, 518), gates of the transistors (FIG. 2, 210), and anodes of the avalanche diodes (FIG. 2, 208). Still further the memristive switching module (634) may carry out the function of identifying a logic value associated with a particular conductance level of the memristive devices (FIG. 1, 102) . . . . The memristive switching module (634) also assists in selecting particular memristive devices (FIG. 1, 102) to target. While specific reference is made to a few particular operations, the memristive switching module (634) carries out a number of different operations in conjunction with the switching of memristive devices (FIG. 1, 102) in the memristive array (514).

Using switch regulating components in a memristive bit cell 1) allows efficient use of multi-level memristive devices; 2) controls set switching and reset switching of a memristive device at a higher granularity to access intermediate states of the memristive device; and 3) makes multi-level memristive devices suitable for various applications including complex vector multiplications, linear transformations, deep neural network operations, cell training, and other operations that implement constant programming. However, it is contemplated that the devices disclosed herein may provide useful in addressing other matters and deficiencies in a number of technical areas. Therefore the systems and methods disclosed herein should not be construed as addressing any of the particular matters.

The preceding description has been presented to illustrate and describe examples of the principles described. This description is not intended to be exhaustive or to limit these principles to any precise form disclosed. Many modifications and variations are possible in light of the above teaching.

What is claimed is:

1. A memristive bit cell comprising:
    a memristive device to store information, wherein the memristive device is switchable between states;
    a first switch regulating component coupled to the memristive device to enforce compliance of the memristive device with a first property threshold when switching between states in a first direction, wherein the first property threshold corresponds to a state of the memristive device; and
    a second switch regulating component coupled to the memristive device to enforce compliance of the memristive device with a second property threshold when switching between states in a second direction, wherein the second property threshold corresponds to the state of the memristive device.

2. The bit cell of claim 1, wherein the first switch regulating component is a transistor coupled to the memristive device.

3. The bit cell of claim 1, wherein the second switch regulating component is an avalanche or Zener diode coupled to the memristive device.

4. The bit cell of claim 1, wherein the first switch regulating component and the second switch regulating component enforce compliance of the memristive element with multiple property thresholds.

5. The bit cell of claim 1, wherein the first property is current.

6. The bit cell of claim 1, wherein the second property is voltage.

7. A memristive array comprising:
    a number of row lines;
    a number of column lines intersecting the row lines to form a number of junctions;
    a number of memristive bit cells coupled between the row lines and the column lines at the junctions, wherein a bit cell comprises:
        a memristive device switchable between states to store information;
        a first switch regulating component to enforce compliance with a current threshold against the memristive device when switching between states in a first direction, wherein the current threshold corresponds to a state of the memristive device; and
        a second switch regulating component to enforce compliance with a voltage threshold against the memristive device when switching between states in a second direction, wherein the voltage threshold corresponds to the state of the memristive device.

8. The array of claim 7, wherein enforcing compliance with the current threshold comprises stopping the switching in the first direction when the current through the memristive device matches the current threshold.

9. The array of claim 7, wherein enforcing compliance with the voltage threshold comprises stopping the switching in the second direction when the voltage across the memristive device matches the voltage threshold.

10. The array of claim 1, further comprising a read component to verify that a value of the memristive device is equal to a selected threshold.

11. A memristive bit cell comprising:
    a memristive device switchable between states to store information;
    a transistor to, during a set operation, enforce compliance of a current passing through the memristive device against one of a number of current thresholds, wherein a current threshold corresponds to a state of the memristive device; and
    a diode to, during a reset operation, enforce compliance of a voltage through the memristive device against one of a number of voltage thresholds, wherein a voltage threshold corresponds to a state of the memristive device.

12. The bit cell of claim 11, wherein the memristive device is switchable between multiple states.

13. The bit cell of claim 11, wherein the memristive device is switchable between more than two states.

14. The bit cell of claim 11, wherein enforcing compliance comprises stopping at least one of a reset operation and a set operation, when a property value of a memristive element is within a tolerance range of a threshold value.

15. The bit cell of claim 11, wherein a state of a memristive device corresponds to a particular voltage threshold and a particular current threshold.

* * * * *